(12) United States Patent
Farooq et al.

(10) Patent No.: US 10,438,894 B1
(45) Date of Patent: Oct. 8, 2019

(54) CHIP-TO-CHIP AND CHIP-TO-SUBSTRATE INTERCONNECTIONS IN MULTI-CHIP SEMICONDUCTOR DEVICES

(71) Applicant: GLOBALFOUNDRIES INC., Grand Cayman (KY)

(72) Inventors: Mukta Farooq, Hopewell Jct, NY (US); Koushik Ramachandran, Wappigners Falls, NY (US); Eric Perfecto, Poughkeepsie, NY (US); Ian Melville, Highland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/993,523

(22) Filed: May 30, 2018

(51) Int. Cl.
| H01L 23/495 | (2006.01) |
| H01L 23/538 | (2006.01) |
| H01L 23/498 | (2006.01) |
| H01L 25/065 | (2006.01) |
| H01L 23/00  | (2006.01) |

(52) U.S. Cl.
CPC .... *H01L 23/5381* (2013.01); *H01L 23/49838* (2013.01); *H01L 24/17* (2013.01); *H01L 25/0652* (2013.01); *H01L 2224/1703* (2013.01); *H01L 2225/0652* (2013.01); *H01L 2225/06517* (2013.01); *H01L 2225/06572* (2013.01)

(58) Field of Classification Search
CPC ........... H01L 23/5381; H01L 23/49838; H01L 24/17; H01L 25/0652
USPC ....................................................... 257/668
See application file for complete search history.

(56) References Cited

U.S. PATENT DOCUMENTS

| 6,150,724 | A  | * | 11/2000 | Wenzel ............... H01L 25/0657 257/724 |
| 6,659,512 | B1 | * | 12/2003 | Harper ................ H01L 25/0657 257/777 |
| 7,098,542 | B1 | * | 8/2006  | Hoang .................... H01L 23/13 257/778 |
| 7,969,009 | B2 |   | 6/2011  | Chandrasekaran |
| 8,138,015 | B2 |   | 3/2012  | Joseph et al. |
| 8,227,904 | B2 |   | 7/2012  | Braunisch et al. |
| 8,836,115 | B1 | * | 9/2014  | St. Amand ............. H01L 23/13 257/737 |
| 9,142,478 | B2 | * | 9/2015  | Kim ........................ H01L 23/36 |
| 9,875,969 | B2 |   | 1/2018  | Braunisch et al. |
| 2012/0207426 | A1 | * | 8/2012 | Doany ................... G02B 6/426 385/14 |

OTHER PUBLICATIONS

Yanfei Chen et al., A 25Gb/s Hybrid Integrated Silicon Photonic Transceiver in 28nm CMOS and SOI, ISSCC 2015, Feb. 25, 2015, 402-404, IEEE, San Francisco, CA, USA.

* cited by examiner

*Primary Examiner* — Luan C Thai
(74) *Attorney, Agent, or Firm* — Hunter Auyang

(57) ABSTRACT

A multi-chip semiconductor device with multi-level structure including a substrate with a top substrate surface, a cavity with a depth in the substrate, a first chip having a top first chip surface with a first chip height, optionally including a second chip having a top second chip surface with a second chip height, and a connecting passive chip bridging the first chip, the second chip and the substrate by solder bumps wherein the solder bumps enable the connecting passive chip to be level.

20 Claims, 7 Drawing Sheets

CHIP-TO-CHIP AND CHIP-TO-SUBSTRATE INTERCONNECTIONS IN MULTI-CHIP SEMICONDUCTOR DEVICES

FIELD OF THE INVENTION

The disclosed embodiments relate generally to multiple chip interconnections in semiconductor devices, and more particularly to interconnections of multiple chips for silicon photonics devices.

BACKGROUND

Silicon photonics is a platform for potentially revolutionary advances in the fields of telecommunications, data communications, medical technology, security, and sensing. Silicon photonics has the potential to realize small, highly integrated, photonics sub-systems that leverage off the decades of silicon fabrication experience, technology and scalability to gain access the full potential of the silicon platform, i.e. silicon photonics for high-speed signaling and sensing, and complimentary metal-oxide semiconductor (CMOS) electronics for subsequent logical operations and computations. Such multi-chip integration also allows for the bridging of different functional technologies, such as micro-electro-mechanical systems (MEMS), III-V materials, non-CMOS application-specific integrated circuits (ASIC) etc.

In a typical silicon photonic package with multi-chip integration scheme, including a V-groove photonic integrated circuit (PIC) chip, a trans-impedance amplifier (TIA) chip and a driver chip, conducting wires (i.e., wire bonding) are used as chip-to-chip and chip-to-substrate interconnections as a flexible, low cost process that is able to accommodate the manufacturing process variations of semiconductor chips as well as those of the substrates. However, with wire bonding and long interconnect paths, the performance of the integrated multi-chip semiconductor devices will have higher parasitic inductance and poorer electrical performance. Flip-chip integration of PIC chip can provide shorter interconnect paths. However, the V-grooves for optical fiber connections are on the active side of the PIC chip, which makes flip-chip integration of such PIC chips challenging because the V-grooves are not easily accessible for optical fiber connections after the flip-chip assembly of the PIC chip.

Thus, it is desirable to provide shorter interconnect paths for the multi-chip semiconductor devices and yet be able to accommodate the various manufacturing process variations, as well as deliver smaller packaging footprints with improved electrical performances.

SUMMARY

A multi-chip semiconductor device with multi-level structure including a substrate with a top substrate surface, a cavity in the substrate, a first chip with a top first chip surface, an additional second chip with a top second chip surface, and a connecting passive chip bridging the first chip, the added second chip and the substrate by solder bumps.

A multi-chip semiconductor device with multi-level structure including a substrate with a top substrate surface, a cavity in the substrate, a first chip with a top first chip surface, a second chip with a top second chip surface at substantially the same height as the top first chip surface, and a connecting through-silicon-via chip bridging the first chip, the second chip and the substrate by solder bumps.

A method of fabricating a multi-chip semiconductor device with multi-level structure includes forming a cavity in a substrate surface and disposing in the cavity a first chip with top first chip surface and a second chip with a top second chip surface, selectively disposing a plurality of first solder bumps and planarizing the plurality of first solder bumps to form a level surface, wherein the sizes of the plurality of first solder bumps can be adjusted to add solder material when the top first chip surface and top second chip surface and the top substrate surface are not at substantially the same height due to tolerances coming from the cavity manufacturing processes (e.g. mechanical milling, laser ablation, etc.). The method further includes using a chip attachment process for mounting the first and second chips in the cavity and preparing a connecting passive chip with a pre-disposed plurality of second solder bumps and a layer of underfill material between the second solder bumps; and electrically bonding the connecting passive chip with the top first chip surface and the top second chip surface and the substrate surface so that the plurality of first solder bumps are aligned with the plurality of second solder bumps.

Numerous advantages may be derived from the embodiments described below wherein wire bonding is replaced. Using a connecting passive chip, the interconnect traces may be fabricated using semiconductor processes. Furthermore, where a side-by-side multi-chip configuration has been previously designed for wire bonding, a flip-chip connecting passive chip interconnect may be easily substituted for the wire bonding, while making use of existing bonding pads. Flip-chip bonding interconnects replacement for wire bonding can reduce the number of assembly steps from multiple separate wire bond steps to a single chip placement.

Moreover, wire bonding typically involves a loop in the arc of the wire between two bonding pads that adds a minimum required distance between the two bonding pads. As a result, wire inductance may degrade performance, especially in high speed devices where inductive impedance increases with frequency. Electromagnetic radiation from the leads may be undesirably detected elsewhere on the chips within the package. With a connecting passive chip, the chips to be connected may be placed closer together, with corresponding shorter interconnect paths, reducing radiation and increasing package utilization efficiency.

BRIEF DESCRIPTION OF THE DRAWINGS

The disclosed embodiments will be better understood from a reading of the following detailed description, taken in conjunction with the accompanying drawings.

Figure 1:
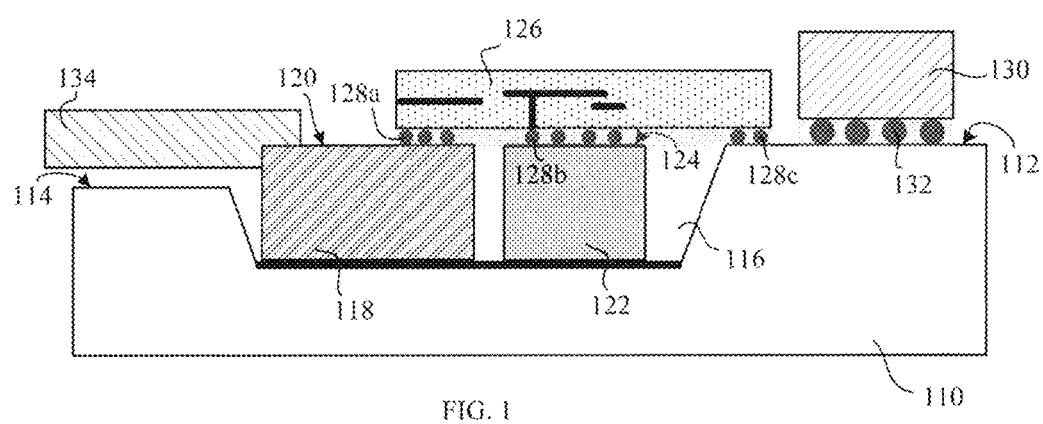
FIG. 1 is a cross-section view of a multi-chip semiconductor device with the height of the active chips substantially the same as the cavity depth.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the device or the application and uses of the device. Furthermore, there is no intention to be bound by any theory presented in the preceding background of the device or the following detailed description.

Structures and methods are disclosed for interconnecting multiple semiconductor chips (dies) and an organic substrate via a semiconductor connecting passive (bridge) chip. The connections may be accomplished by the connecting passive chip to make contact with the active semiconductor chip and the substrate or to make contact with two semiconductor chips. In some embodiments, the connecting passive chip can have a design enabled for hybrid assembly, such as having solder bumps for flip-chip interconnections and through-silicon vias (TSV) for connections on the opposite surface of the connecting passive chip. Interconnect lines on the connecting passive chip are formed to complete the electrical and/or optical connections between the multi-chips in the substrate-based package.

There are several advantages of using a connecting passive chip and flip-chip bonding, because the electrical interconnections formed typically result in a smaller device footprint, the ability to integrate more I/Os, improved electrical performances, improved reliability, improved thermal capabilities and at a lower cost. Furthermore, vertical integration of multiple chips for a semiconductor device provides shorter interconnect paths and higher integration density in a small area as compared with horizontal integration relying on the embedded copper wires in an organic substrate.

FIG. 1 is a cross-section view of a multi-chip semiconductor device 100, in accordance with embodiments of the device. More specifically, with reference to FIG. 1, the multi-chip semiconductor device 100 comprises a substrate 110, active chips 118, 122 and 130, a connecting passive chip 126, and an optical fiber 134. In one embodiment, for example, the active chip 118 is a photonic integrated circuit (PIC) chip including a silicon waveguide and other electro-optical circuitry with V-groove features for fiber optic coupling, the active chip 122 is a trans-impedance amplifier (TIA) chip, the active chip 130 is a driver chip and the connecting passive chip 126 is a chip with metal interconnections that has no functionality other than to provide interconnections between the other chips and substrate.

Further illustrated by FIG. 1, the substrate 110 comprises a top surface 112 and a top surface 114 with a cavity 116. The top substrate surfaces 112 and 114 are at different levels. It should be understood, although not shown in the figures, that the top substrate surfaces 112 and 114 can also be at the same level. The active chip 118 with a top chip surface 120 and the active chip 122 with a top chip surface 124 are mechanically attached in the cavity 116 by a layer of thermally and/or electrically conductive epoxy (not labelled). The height of the active chips 118 and 122 is substantially the same as the cavity depth 116 and therefore the top active chip surfaces 120 and 124 and the top substrate surface 112 are substantially levelled. To achieve this level surface, there needs to be strict design and production controls, which is not always possible or necessary.

A connecting passive chip 126 bridges the active chip 118, the active chip 122 and the substrate 110 by flip-chip bonding of solder bumps 128a, 128b and 128c. Solder bumps 128a are deposited on the top active chip surface 120, solder bumps 128b are deposited on the top active chip surface 124 and solder bumps 128c are deposited on the top substrate surface 112. From the respective pre-determined heights of the active chips and the cavity depth, the appropriate sizes of the solder bumps can be determined before they are placed on the chips and substrate. The sizes of solder bumps 128a, 128b and 128c are substantially the same and formed by joining a first layer of solder bumps on the substrate and active chips and a corresponding second layer of solders bumps on the connecting passive chip.

The active chip 130 is connected to the top substrate surface 112 by solder bumps 132 and is connected to the connecting passive chip 126 by copper wires embedded in the substrate 110. The embedded copper wires in the substrate are not shown in FIG. 1 nor in the following figures. The solder bumps 132 need not be the same sizes as solder bumps 128a, 128b and 128c. An optical fiber 134 is coupled to the top chip surface 120 with an optical adhesive and extending away from the connecting passive chip 126 and laying over the top substrate surface 114. The top chip surface 120 has V-grooves for optical fiber coupling. The connecting passive chip 126 creates a connection (e.g. an electrical and/or optical connection or the like) between active chips 118, 122 and 132 by matching electrically and/or optically conductive traces running through the connecting passive chip 126 and the embedded copper wires in the substrate to pads or other interconnect structures on the active chips and the substrate.

The prerequisite for flip-chip connections are substantially level surfaces. For connecting chips to use flip-chip bonding as interconnects, chip-to-chip and chip-to-substrate surfaces have to be substantially levelled. Unleveled surfaces will cause unreliable solder bump connections, such as shorting of the circuit with merging of two or more solder bumps or solder bumps not in or having sufficient contact with required pads or other interconnect structures. Due to manufacturing process variations, it is often difficult and costly to obtain a chip-to-chip and/or chip-to-substrate levelled surfaces. The cavity depth and the various chip heights can be precisely manufactured to pre-determined specifications to achieve a substantially level surface. Alternatively, each can be pre-determined according their respective manufacturing requirements and their heights measured thereafter. In order to overcome the variation of the manufacturing processes and to comply with the level surface requirement for reliable flip-chip connection, there is a need to provide a method that is able to accommodate the process variations in both the silicon chips manufacturing and substrates manufacturing.

Figure 2:
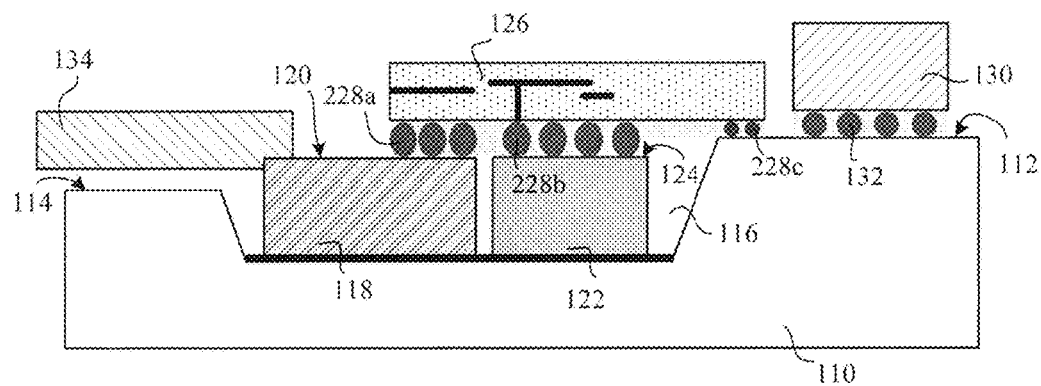
FIG. 2 is a cross-section view of a multi-chip semiconductor device with the height of the active chips less than the cavity depth.

FIG. 2 illustrates another embodiment of a multi-chip semiconductor device 200. The device 200 has active chips 118 and 122 with a pre-determined height that is less than the cavity depth 116. Since the active chips are typically silicon devices, it may be possible to more closely control the chip heights. Top active chip surfaces 120 and 124 are substantially levelled and lie below a top substrate surface 112. From the pre-determined heights of the active chips and the cavity depth, the appropriately sized solder bumps 228a are deposited on the top active chip surface 120, solder bumps 228b are deposited on the top active chip surface 124 and solder bumps 228c are deposited on the top substrate surface 112. The selective deposition of the solder bumps results in the solder bumps 128a and 128b being larger and having greater volume, by providing more solder material, than solder bumps 128c to compensate for the difference in height between the active chips 118 and 122 and the cavity depth 116. The solder bumps 228a, 228b and 228c are subsequently planarized to ensure a substantially levelled chip-to-chip and chip-to-substrate surface before the connecting passive chip having a layer of corresponding solder bumps is attached to enable the connecting passive chip 126 to have a level, reliable flip-chip connection to top active chip surfaces 120, active chip 124 and top substrate surface 112.

Figure 3:
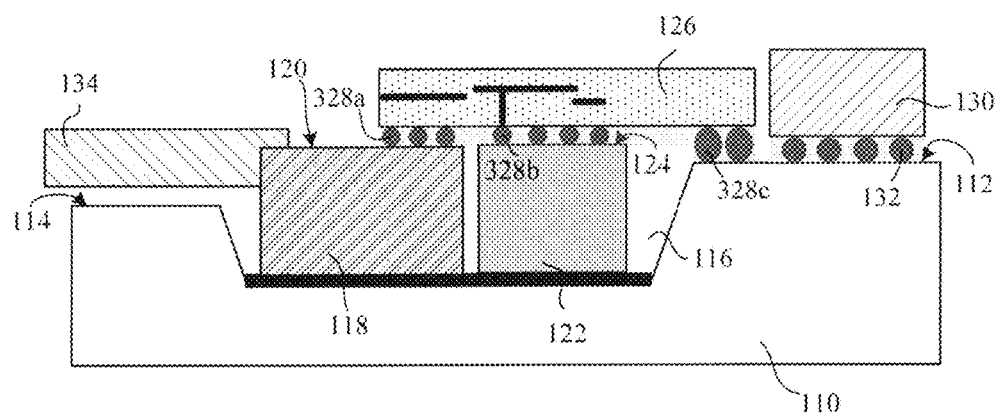
FIG. 3 is a cross-section view of a multi-chip semiconductor device with the height of the active chips greater than the cavity depth.

FIG. 3 illustrates another embodiment of a multi-chip semiconductor device 300. The device 300 has active chips 118 and 122 with a pre-determined height that is greater than a pre-determined cavity depth 116. As a result, top active chip surfaces 120 and 124 are substantially levelled and are above a top substrate surface 112. From the pre-determined heights of the active chips and the cavity depth, the appropriately sized solder bumps 328a are deposited on the top active chip surface 120, solder bumps 328b are deposited on the top active chip surface 124 and solder bumps 328c are deposited on the top substrate surface 112. The selective deposition of the solder bumps results in the solder bumps 328c being larger and having greater volume, by providing more solder material, than solder bumps 328a and 328b to compensate for the difference in height between the active chips 118 and 122 and the cavity depth 116. The solder bumps 328a, 328b and 328c are subsequently planarized to create a substantially levelled chip-to-chip and chip-to-substrate surface before the connecting passive chip having a layer of corresponding solder bumps is attached to enable the connecting passive chip 126 to have a level, reliable flip-chip connection to top active chip surfaces 120, active chip 124 and top substrate surface 112.

Figure 4:
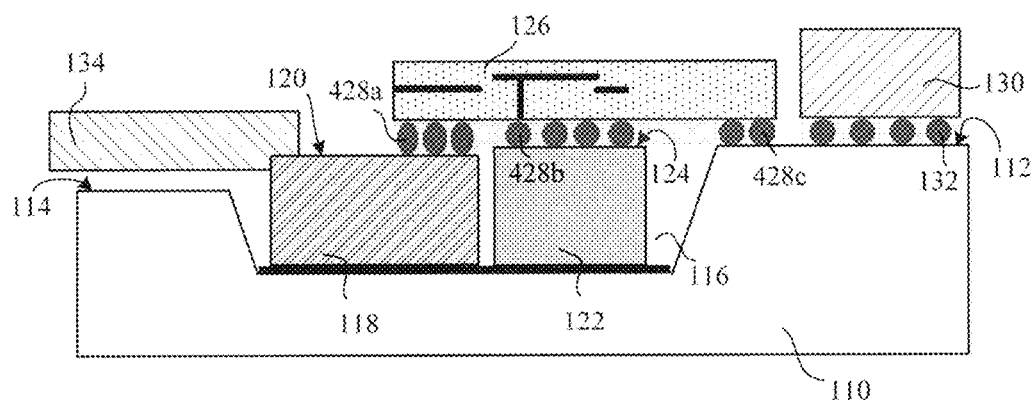
FIG. 4 is a cross-section view of a multi-chip semiconductor device with the height of one active chip is less than the cavity depth, while the height of another active chip is substantially the same as the cavity depth.

FIG. 4 illustrates another embodiment of a multi-chip semiconductor device 400. The device 400 has an active chip 118 with a pre-determined height that is less than a cavity depth 116, and an active chip 122 with a height that is substantially the same as the cavity depth 116, because the cavity depth is set at the height of the active chip 122. As a result, a top active chip surface 124 is substantially levelled with a top substrate surface 112 while a top active chip surface 120 lies below the top substrate surface 112. From the pre-determined heights of the active chips and the cavity depth, the appropriately sized solder bumps 428a are deposited on the top active chip surface 120, solder bumps 428b are deposited on the top active chip surface 124 and solder bumps 428c are deposited on the top substrate surface 112. The selective deposition of the solder bumps results in the solder bumps 428a being larger and having greater volume, by providing more solder material, than solder bumps 428b and 428c to compensate for the difference in height between the active chip 118 and the cavity depth 116. The solder bumps 428a, 428b and 428c are subsequently planarized to create a substantially levelled chip-to-chip and chip-to-substrate surface before the connecting passive chip having a layer of corresponding solder bumps is attached to enable the connecting passive chip 126 to have a level, reliable flip-chip connection to top active chip surfaces 120, active chip 124 and top substrate surface 112.

In the disclosed embodiments, for example, the height difference between the top active chip surfaces 120 and 124 can be typically about +/−20 um from the top substrate surface 112. Accordingly, the required height for 150 um pitch solder bumps to achieve a substantially levelled chip-to-chip and chip-to-substrate surface is approximately 80 um to 100 um. Depending on the physical pitch constraints, it is understood that the solder bumps may be larger or smaller.

It is conventional to use an underfill material to improve the reliability of the solder bumps. The underfill provides additional mechanical strength and also prevents moisture-related corrosion of the solder bumps. The underfill may be applied via a conventional method at a wafer level, b-staged and diced. A heat-controlled solder-reflow process is then used to bond the solder bumps, permanently fusing the corresponding solder bumps together. Alternatively, the underfill can be dispensed after the flip-chip bonding is made via a capillary process.

The active chip 130 may be connected to the top substrate surface 112 (or other parts of the substrate surface with interconnect structures) before or after the flip-chip connection between the connecting passive chip 126 and the active chips 118, 122 and the substrate 110 have been made.

In the present method, each of the substrate and active chip top surfaces can have a different size of solder bump respectively. An alternate method to achieve a level solder bump surface on the active chips 118 and 122 for flip-chip connection is to deposit the largest required volume of solder material across the top active chip surfaces 120 and 124, and the top substrate surface 112. The largest volume of solder material can be determined by using the greatest difference in height between either one of the active chip surfaces and the substrate surface to calculate the volume. The deposited volume of the solder bumps are the same and the excess solder bump material from those solder bumps on a highest level (i.e., on the top active chip surfaces and/or the substrate) can be planarized to form a level surface.

Other embodiments of the semiconductor device may include the height of the active chip 118 being greater than the cavity depth 116 while the height of the active chip 122 is substantially the same as the cavity depth 116. The height of the active chip 122 can be greater than the cavity depth 116 while the height of the active chip 118 is substantially the same as the cavity depth 116 or the height of the active chip 122 can be less than the cavity depth while the height of the active chip 118 being substantially the same as the cavity depth 116 or the like. Although the above embodiments are not shown in the drawings, by adjusting and selectively depositing controlled volume of solder bumps, the disclosed embodiments are able to compensate the variation of the heights of active chips and cavity depth to accommodate to the manufacturing process variations of the silicon chips and substrates.

The traditional solder-fluxes used in integrated circuit packaging are generally not preferred in silicon photonic packaging because they can leave behind chemical residue that contaminates the optical interfaces for optical fiber-to-PIC coupling. This can lead to increased insertion losses and also a weakening of the mechanical optical fiber-to-PIC bond. Instead, a 'no clean' flux can be used during the solder-reflow bonding. The preferred flux is VOC-free (volatile organic compounds) and activates and evaporates at the melting-point of the solder, so it does not require a post-bonding solvent-rinse that can contaminate the PIC. During interconnect bonding, a formic acid environment is used, which enables any tin oxide (SnOx) compounds that may be present to volatilize during reflow. Alternatively, water-soluble fluxes may be used only if there is adequate cleaning.

Figure 5:
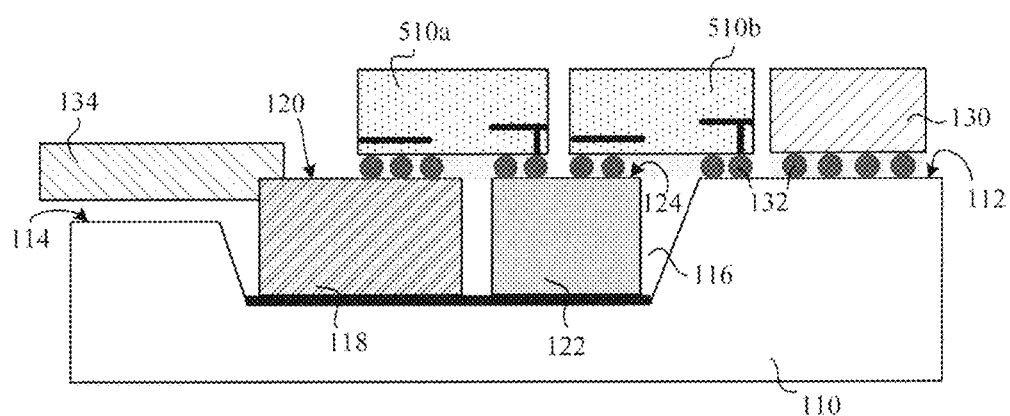
FIG. 5 is a cross-section view of a multi-chip semiconductor device using two connecting passive chips to form a chip-to-chip and a chip-to-substrate connection.

FIG. 5 illustrates another embodiment of the multi-chip semiconductor device 500. The device 500 has two connecting passive chips 510a and 510b. The connecting passive chip 510a bridges top active chip surfaces 120 and 124, and the connecting passive chip 510b bridges a top active chip surface 124 and a top substrate surface 112.

Figure 6A:
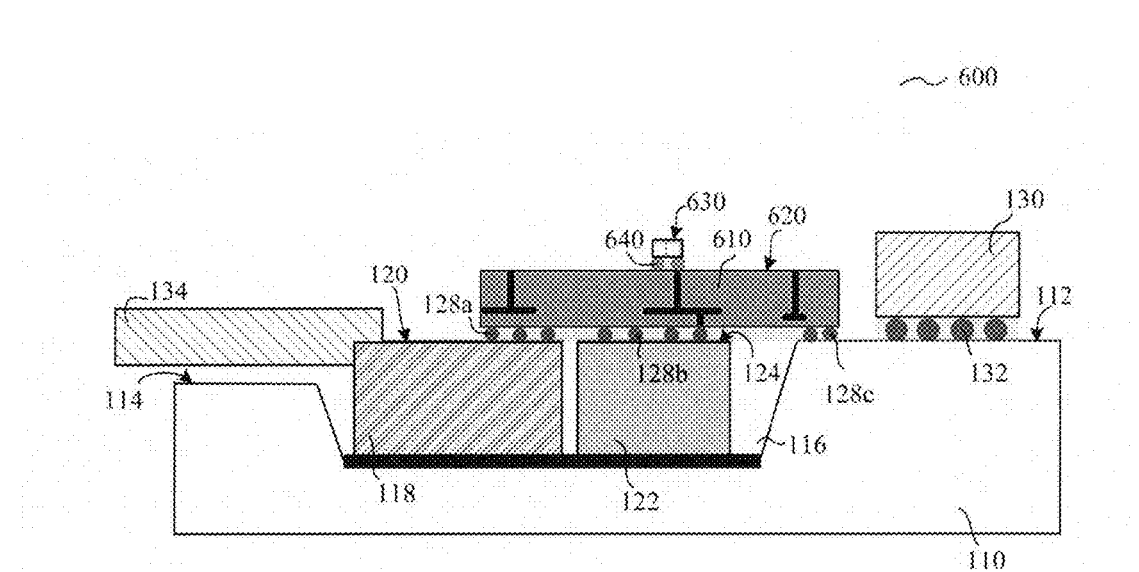
FIG. 6A is a cross-section view of a multi-chip semiconductor device with a passive chip that is flip-chip bonded on top of a connecting TSV chip.

FIG. 6A illustrates another embodiment of a multi-chip semiconductor device 600. The device 600 has a connecting passive chip 610 designed for hybrid assembly and has through-silicon-vias (TSV). The connecting TSV chip 610 bridges top active chip surfaces 120 and 124 to a top substrate surface 112. The connecting TSV chip 610 has metal interconnect lines that enables electrical and/or optical connections on a connecting TSV chip surface 620. A passive chip 630 is attached to the connecting TSV chip surface 620 and vertically integrated to the device 600 by flip-chip bonding to the connecting TSV chip 610 with solder bumps 640. In one embodiment, the passive chip 630 is a resistor, a capacitor, an inductor or any other passive component incapable of controlling current by means of another electrical signal or the like. More than one passive component can be flip-chip bonded to the connecting TSV chip surface 620.

Figure 6B:
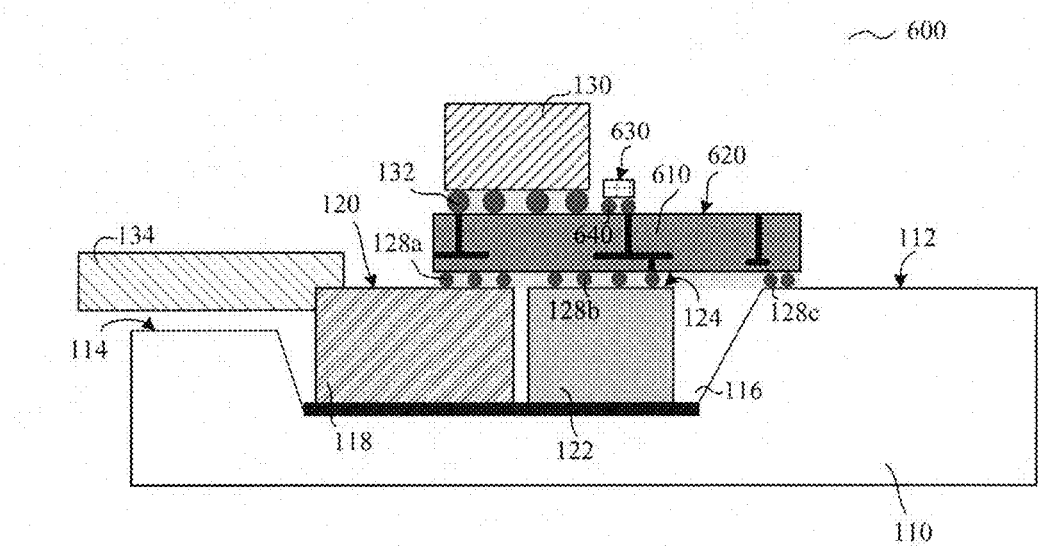
FIG. 6B is a cross-section view of a multi-chip semiconductor device with a passive chip and an active chip that are flip-chip bonded on top of a connecting TSV chip.

FIG. 6B illustrates the multi-chip semiconductor device 600 having a third active chip 130 (chip 118 and chip 122 being the first two active chips) vertically integrated to the device 600 by flip-chip bonding to the connecting TSV chip surface 620. Solder bumps 132 do not have to be the same size as solder bumps 640.

Figure 7A:
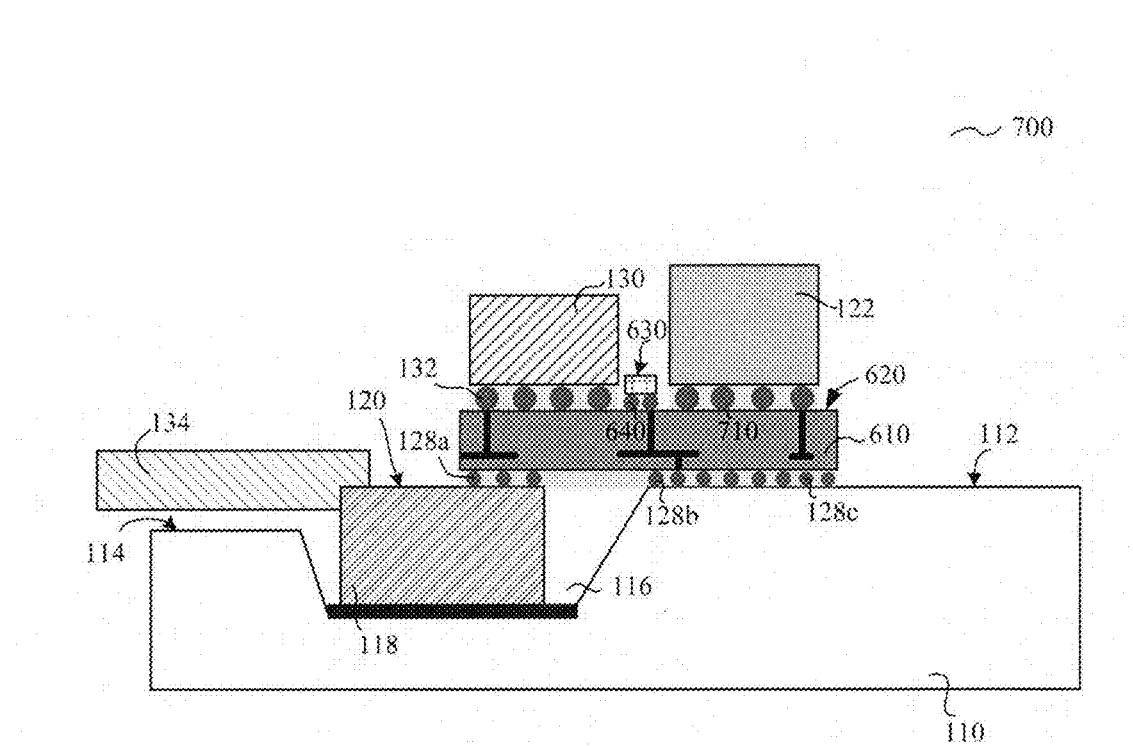
FIG. 7A is a cross-section view of a multi-chip semiconductor device with a passive chip and two active chips that are flip-chip bonded on top of a connecting TSV chip.

FIG. 7A illustrates an alternative embodiment of a multi-chip semiconductor device 700. An active chip 118 with a top active chip surface 120 is mechanically attached in a cavity 116. A connecting TSV chip 610 with metal interconnect lines on a surface 620 bridges the top active chip surface 120 to a top substrate surface 112 at a second chip level. A third active chip 130 with solder bumps 132 and a second active chip 122 with solder bumps 710 are vertically integrated into device 700 by flip-chip bonding to the connecting TSV chip surface 620. A passive chip 630 is further attached to the connecting TSV chip surface 620 by flip-chip bonding of solder bumps 640. While not shown, to further shorten the interconnect paths and increase the integration density, the solder bumps 132, 630 and 710 can be replaced with smaller pitch micropillar connections (e.g. copper pillars with tin-silver (SnAg) solder). The placements of the active and passive chips need not occur in the order shown in this figure and the solder bumps 132, 640 and 710 are not required to be the same size.

Figure 7B:
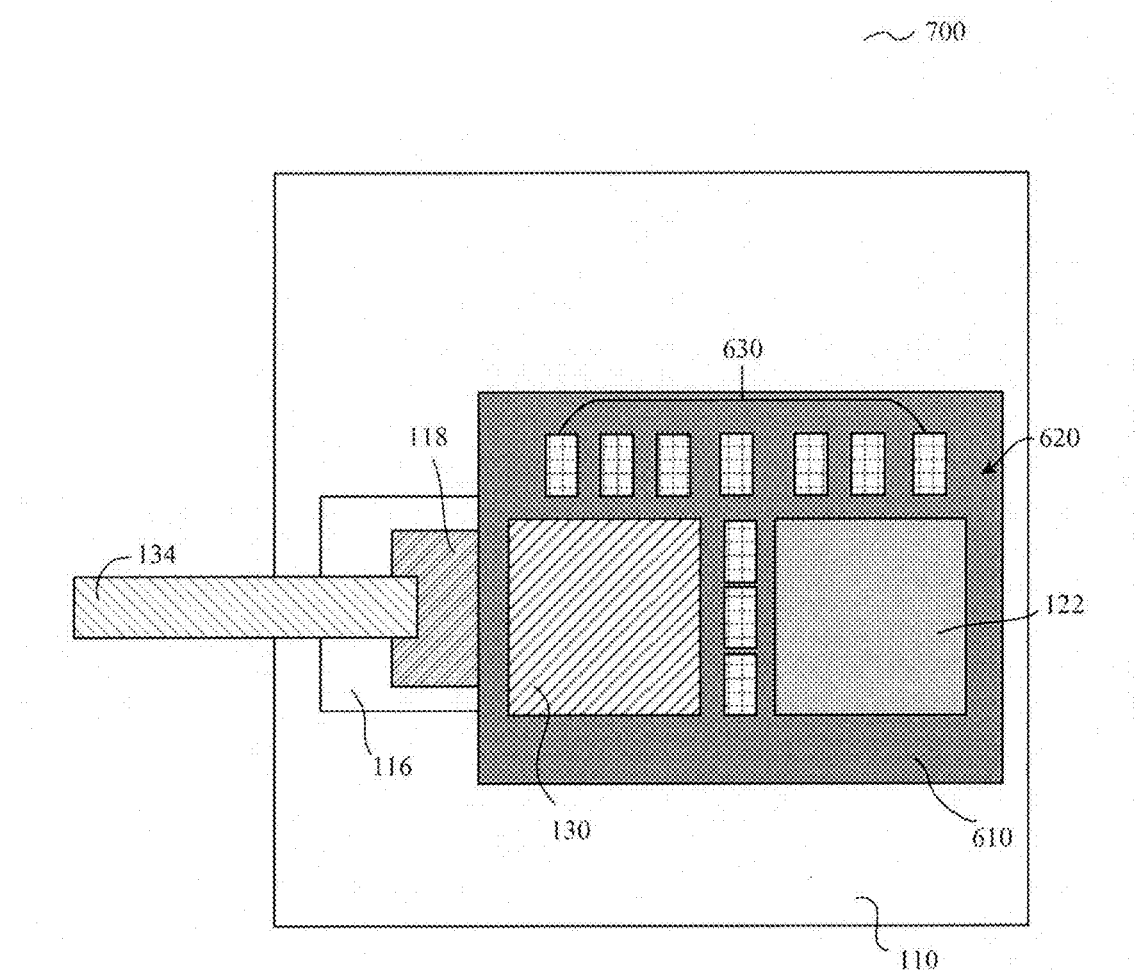
FIG. 7B is a top view of a multi-chip semiconductor device with multiple passive chips and two active chips that are flip-chip bonded on top of a connecting TSV chip.

FIG. 7B is a top view of a multi-chip semiconductor device 700. Multiple passive chips 630 are flip-chip bonded on a surface 620 of a connecting TSV chip 610. In one embodiment, the passive chip 630 is a resistor, a capacitor, an inductor or any other passive component incapable of controlling current by means of another electrical signal or the like. Using such vertical integration scheme, the interconnect path between the active chips and the connecting TSV chip is shortened and the integration density is greatly increased to achieve a smaller package size.

It is understood that wire bond interconnections still have advantages as a low cost, flexible and reliable process with low defect rates. Coupled with rapid advances in equipment, tools and material technology, wire bonding can coexist with flip-chip bonding in the integrated circuit packaging market. It should be appreciated that the semiconductor chips disclosed herein can have designs enabled for hybrid assembly that use both flip-chip bonding and wire bonding.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed:
1. A multi-chip semiconductor device comprising:
  a substrate having a first and second top substrate surfaces and a cavity having a cavity depth positioned therebetween;
  a first active chip having a top first active chip surface in the cavity; and a connecting passive chip bridging the top first active chip surface with only the first top substrate surface, the connecting passive chip is coupled to the first active chip by a plurality of first active chip solder bumps and to the first top substrate surface by a plurality of substrate solder bumps, wherein the size of the plurality of first active chip solder bumps and the size of the plurality of substrate solder bumps are such that the connecting passive chip is substantially parallel to the first and second top substrate surfaces.

2. The device of claim 1 wherein the first active chip has a height that is greater than the cavity depth and each of the plurality of first active chip solder bumps are smaller than each of the plurality of substrate solder bumps.

3. The device of claim 1 wherein the first active chip has a height that is less than the cavity depth and each of the plurality of first active chip solder bumps are larger than each of the plurality of substrate solder bumps.

4. The device of claim 1 wherein a second active chip is disposed in the cavity with the first active chip, the second active chip having a top second active chip surface with a second active chip height; and
the connecting passive chip is bridging the top first active chip surface, the top second active chip surface and the first top substrate surface and the connective passive chip is electrically coupled to the first active chip using the plurality of first active chip solder bumps and coupled to the second active chip using a plurality of second active chip solder bumps and coupled to the first top substrate surface by the plurality of substrate solder bumps, wherein the size of the plurality of the second active chip solder bumps is determined by the second active chip height.

5. The device of claim 4 wherein the second active chip height is greater than the cavity depth and each of the plurality of second active chip solder bumps are smaller than each of the plurality of substrate solder bumps.

6. The device of claim 4 wherein the second active chip height is less than the cavity depth and each of the plurality of second active chip solder bumps are larger than each of the plurality of substrate solder bumps.

7. The device of claim 4 wherein the plurality of first active chip solder bumps, second active chip solder bumps and substrate solder bumps have sizes in the range of 80 um to 100 um.

8. The device of claim 1, wherein the level of the first top substrate surface of the substrate is different from the level of the second top substrate surface.

9. The device of claim 1, wherein the level of the first top substrate surface of the substrate is the same as the level of the second top substrate surface.

10. The device of claim 1 wherein the connecting passive chip is a through-silicon via (TSV) chip and a third active chip is electrically bonded on top of the TSV chip.

11. The device of claim 1 wherein the connecting passive chip comprises a first and second passive bridging chips wherein the first passive bridging chip is bridging the top first active chip surface with the first top substrate surface and the second passive bridging chip is bridging the top first active chip surface with the top second active chip surface.

12. The device of claim 1 wherein the first active chip is a photonic integrated circuit chip and an optical fiber is attached to the first active chip, extending away from the connecting passive chip and laying over the second top substrate surface.

13. A multi-chip semiconductor device comprising:
a substrate having a first and second top substrate surfaces and a cavity having a cavity depth positioned therebetween;
a first active chip and a second active chip in the cavity, the first active chip having a top first active chip surface with a first active chip height and the second active chip having a top second active chip surface with a second active chip height;
the top first active chip height and the top second active chip height are substantially at the same level; and
a connecting passive through-silicon via (TSV) chip is bridging the top first active chip surface and the top second active chip surface with only the first top surface of the substrate, wherein the connecting TSV chip is electrically bonded to the first active chip using a plurality of first active chip solder bumps and to the second active chip using a plurality of second active chip solder bumps and to the first top substrate surface by a plurality of substrate solder bumps.

14. The device of claim 13 wherein the first active chip height and second active chip height are greater than the cavity depth.

15. The device of claim 13 wherein the first active chip height and second active chip height are less than the cavity depth.

16. A method of fabricating a multi-chip semiconductor device comprising:
forming a cavity with a cavity depth in a substrate surface;
disposing in the cavity a first chip having a top first chip surface with a first chip height and a second chip having a top second chip surface with a second chip height;
selectively disposing a plurality of first solder bumps onto the substrate surface, the top first chip surface and the top second chip surface, and followed by planarizing the plurality of first solder bumps to form a level surface, wherein the respective sizes of the plurality of first solder bumps on the substrate surface, the top first chip surface and the top second chip surface can be adjusted with added solder material when the top first chip surface and the top second chip surface and the substrate surface are not at substantially the same height;
preparing a connecting passive chip with a pre-disposed plurality of second solder bumps and a layer of underfill material between the second solder bumps; and
electrically bonding the connecting passive chip with the top first chip surface, the top second chip surface and the substrate surface so that the plurality of first solder bumps are aligned with the plurality of second solder bumps.

17. The method of claim 16 further comprises the connecting passive chip having through-silicon-via (TSV) and electrically bonding a third chip at the TSV.

18. The device of claim 8 wherein the second top substrate surface has a height that is below the first top substrate surface.

19. The device of claim 1 further comprises a third active chip electrically bonded by a plurality of third active chip solder bumps onto the first top substrate surface.

20. The device of claim 13 wherein the second top substrate surface has a height that is below the first top substrate surface.

* * * * *